United States Patent
Yang et al.

(10) Patent No.: US 7,648,865 B1
(45) Date of Patent: Jan. 19, 2010

(54) METHOD FOR MANUFACTURING PIXEL STRUCTURE

(75) Inventors: Chih-Chun Yang, Hsinchu County (TW); Ming-Yuan Huang, Taipei County (TW); Han-Tu Lin, Taichung County (TW); Chih-Hung Shih, Yilan County (TW); Ta-Wen Liao, Miaoli County (TW); Kuo-Lung Fang, Hsinchu (TW); Chia-Chi Tsai, Kaohsiung (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 12/233,607

(22) Filed: Sep. 19, 2008

(30) Foreign Application Priority Data

Jun. 27, 2008 (TW) ............................... 97124271 A (51) Int. Cl.
*H01L 21/00* (2006.01)
(52) U.S. Cl. ................ 438/149; 438/151; 257/E21.001
(58) Field of Classification Search ................. 438/149, 438/151; 257/E21.001
See application file for complete search history.

(56) References Cited

U.S. PATENT DOCUMENTS

| | | | |
|---|---|---|---|
| 5,514,618 A | 5/1996 | Hunter, Jr. et al. | |
| 5,614,728 A | 3/1997 | Akiyama | |
| 7,064,347 B2 | 6/2006 | Chang et al. | |
| 7,491,557 B2 * | 2/2009 | Park ............................ | 438/29 |
| 2004/0197966 A1 | 10/2004 | Cho et al. | |
| 2005/0179036 A1 | 8/2005 | Yamazaki et al. | |
| 2006/0008952 A1 | 1/2006 | Wu et al. | |
| 2006/0099747 A1 | 5/2006 | Park | |

* cited by examiner

*Primary Examiner*—Jack Chen
(74) *Attorney, Agent, or Firm*—Jianq Chyun IP Office (57) ABSTRACT

A method for manufacturing a pixel structure is provided. First, a gate and a gate insulating layer are sequentially formed on the substrate. A channel layer and a second metal layer are sequentially formed on the gate insulating layer. The second metal layer is patterned to form a source and a drain by using a patterned photoresist layer formed thereon, wherein the source and the drain are disposed on a portion of the channel layer. The gate, the channel, the source and the drain form a thin film transistor. A passivation layer is formed on the patterned photoresist layer, the gate insulating layer and the thin film transistor. Then, the patterned photoresist layer is removed, such that the passivation layer thereon is removed simultaneously to form a patterned passivation layer and the drain is exposed. A pixel electrode is formed on the patterned passivation layer and the drain.

10 Claims, 8 Drawing Sheets

METHOD FOR MANUFACTURING PIXEL STRUCTURE

CROSS-REFERENCE TO RELATED APPLICATION

This application claims the priority benefit of Taiwan application serial no. 97124271, filed on Jun. 27, 2008. The entirety of the above-mentioned patent application is hereby incorporated by reference herein and made a part of this specification.

BACKGROUND OF THE INVENTION

1. Field of the Invention

The present invention relates to a method for manufacturing a pixel structure, and in particular, to a method for manufacturing a pixel structure, which utilizes a lift-off process to manufacture a passivation layer.

2. Description of Related Art

Displays are a communication interface between human and information. Currently, flat panel displays are the main trend in development. The flat panel displays may mainly have the following categories: organic electroluminescence display, plasma display, and thin film transistor liquid crystal display (TFT-LCD), in which TFT-LCD is the most widely used. In general, a TFT-LCD is constituted by a TFT array substrate, a color filter array substrate, and a liquid crystal layer. The TFT array substrate includes a plurality of scan lines, a plurality of data lines, and a plurality of pixel structures arranged in an array. Each pixel structure is electrically connected to the corresponding scan line and data line.

Figure 1A:
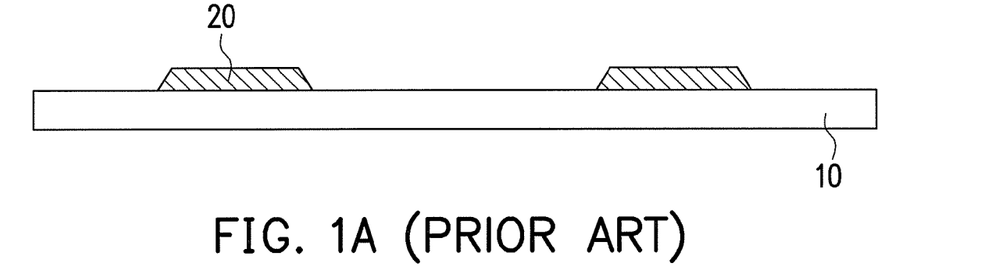
FIGS. 1A to 1G illustrate a processing flow of manufacturing a conventional pixel structure.
Figure 1B:
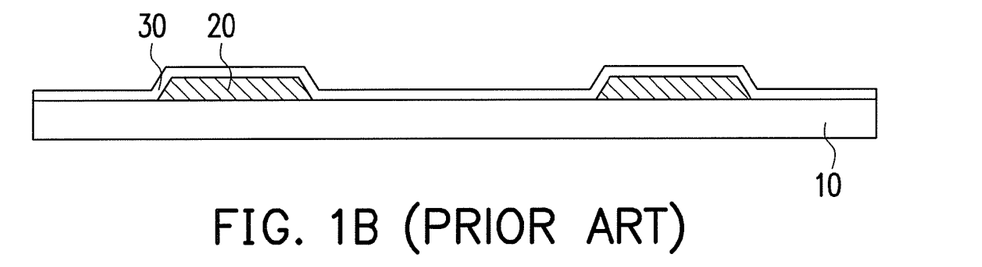
Figure 1C:
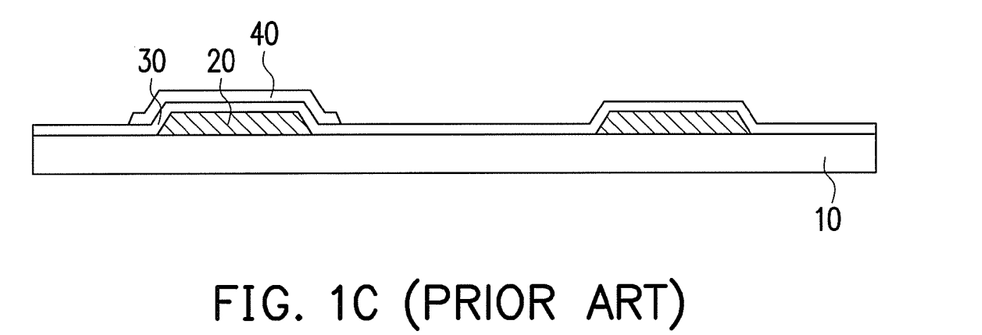
Figure 1D:
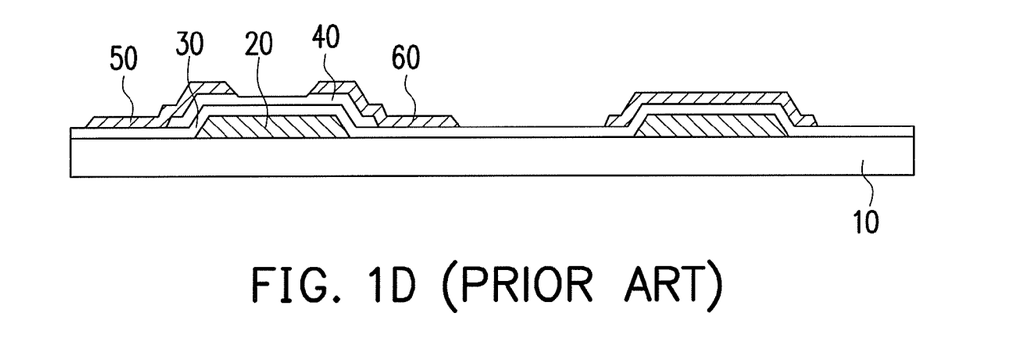
Figure 1E:
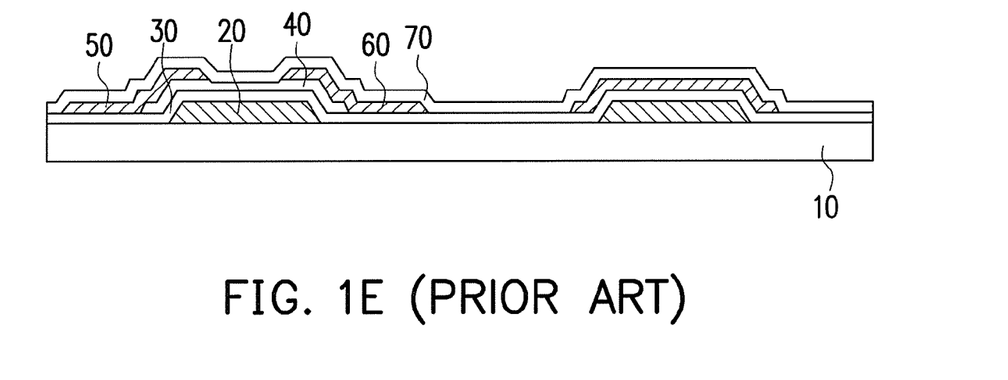
Figure 1F:
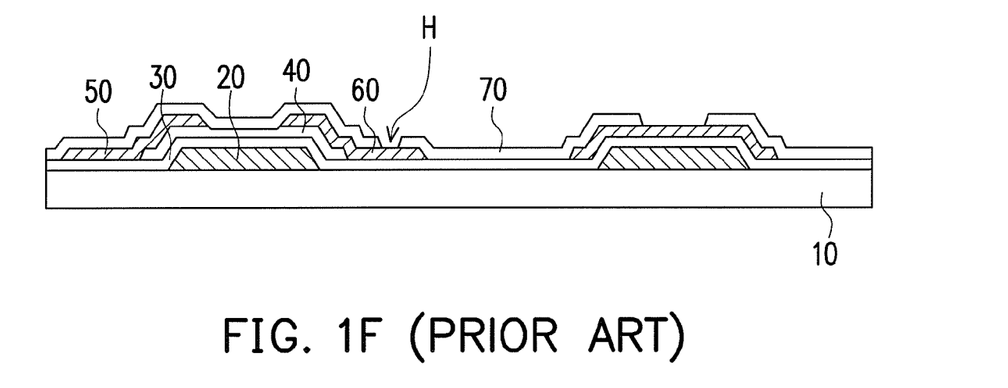
Figure 1G:
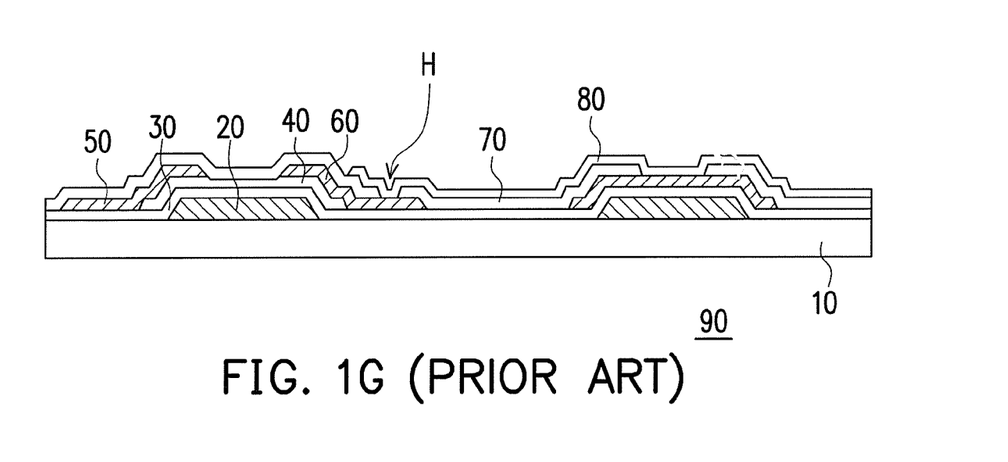

FIGS. 1A to 1G are schematic views of a conventional method for fabricating a pixel structure. Referring to FIG. 1A, first, a substrate 10 is provided, and a gate 20 is formed on the substrate 10 using a first photolithography and etching process. Next, referring to FIG. 1B, a gate insulating layer 30 is formed on the substrate 10 to cover the gate 20. Afterwards, referring to FIG. 1C, a channel layer 40 above the gate 20 is formed on the gate insulating layer 30 using a second photolithography and etching process. In general, a material of the channel layer 40 is amorphous silicon. Then, referring to FIG. 1D, a source electrode 50 and a drain electrode 60 are formed on partial regions of the channel layer 40 and the gate insulating layer 30 using a third photolithography and etching process. Observed from FIG. 1D, the source electrode 50 and the drain electrode 60 respectively extend onto the gate insulating layer 30 from both sides of the channel layer 40, and expose a portion of the channel layer 40. Next, referring to FIG. 1E, a passivation layer 70 is formed on the substrate 10 to cover the gate insulating layer 30, the channel layer 40, the source electrode 50, and the drain electrode 60. Thereafter, referring to FIG. 1F, the passivation layer 70 is patterned by a fourth photolithography and etching process to form a contact hole H in the passivation layer 70. In FIG. 1F, the contact hole H in the passivation layer 70 exposes a portion of the drain electrode 60. Then, referring to FIG. 1G, a pixel electrode 80 is formed on the passivation layer 70 by a fifth photolithography and etching process, and observed from FIG. 1G, the pixel electrode 80 is electrically connected to the drain electrode 60 through the contact hole H. After the pixel electrode 80 is formed, the fabrication of the pixel structure 90 is completed.

In view of the above, the conventional pixel structure 90 is mainly fabricated by the five photolithography and etching processes. In other words, the pixel structure 90 must be fabricated with the five photo-masks of the different patterns. The photo-masks are of high price, and each photolithography and etching process requires a photo-mask of a different pattern. If the photolithography and etching processes cannot be simplified, the fabrication cost of the conventional pixel structure cannot be reduced.

Besides, with the increasing of the size of the TFT-LCD panel, the size of the photo-mask for fabricating the TFT array substrate is also enlarged, so the photo-mask of a larger size becomes more expensive, and the fabrication cost of the conventional pixel structure cannot be effectively lowered.

SUMMARY OF THE INVENTION

The present invention is directed to a method for manufacturing a pixel structure capable of reducing the process cost.

As embodied and broadly discussed herein, the present invention provides a method for fabricating a pixel structure. First, a gate is formed on a substrate, and a gate insulating layer is formed on the substrate to cover the gate. Next, a channel layer is formed on the gate insulating layer, and a second metal layer is formed on the channel layer. Then, a patterned photoresist layer is formed on the second metal layer, and a portion of the second metal layer is removed by using the patterned photoresist layer as a mask, so as to form a source and a drain on the channel layer at two sides of the gate, wherein the gate, the channel layer, the source, and the drain constitute a thin film transistor. After that, a passivation layer is formed on the patterned photoresist layer, the gate insulating layer, and the thin film transistor. Then, the patterned photoresist layer is removed, so that the passivation layer thereon is removed simultaneously to form a patterned passivation layer and to expose the source and the drain. Thereafter, a pixel electrode is formed on the patterned passivation layer and the drain.

According to one embodiment of the present invention, the step of forming the gate includes that, for example, a first metal layer is formed on the substrate first, and then the first metal layer is patterned to form the gate.

According to one embodiment of the present invention, the step of patterning the first metal layer includes performing a laser ablation process or performing a photolithography and etching process.

According to one embodiment of the present invention, the step of forming the channel layer includes that, for example, a semiconductor layer is formed on the gate insulating layer, and then the semiconductor layer is patterned to form the channel layer.

According to one embodiment of the present invention, the step of patterning the semiconductor layer includes performing a laser ablation process or performing a photolithography and etching process.

According to one embodiment of the present invention, the step of forming the gate insulating layer includes, for example, forming a silicon nitride layer through a chemical vapor deposition (CVD) process.

According to one embodiment of the present invention, the step of forming the pixel electrode includes, for example, forming a conductive layer on the patterned passivation layer and the remaining second metal layer. Then, the conductive layer is patterned to form the pixel electrode.

According to one embodiment of the present embodiment, the step of forming the conductive layer includes, for example, forming an indium tin oxide (ITO) layer or an indium zinc oxide (IZO) layer by performing a sputtering process.

According to one embodiment of the present invention, the step of patterning the conductive layer includes performing a laser ablation process or performing a photolithography and etching process.

As embodied and broadly discussed herein, the present invention provides a method for fabricating a pixel structure. First, a gate is formed on a substrate. Next, a gate insulating layer is formed on the substrate to cover the gate. A semiconductor layer is formed on the gate insulating layer, and a second metal layer is formed on the semiconductor layer. Then, a patterned photoresist layer is formed on the second metal layer, a portion of the second metal layer and a portion of the semiconductor layer are removed by using the patterned photoresist layer as a mask, so as to form a channel layer, a source, and a drain on the gate insulating layer over the gate simultaneously, wherein the source and the drain are disposed on a portion of the channel layer, and the gate, the channel layer, the source, and the drain constitute a thin film transistor. A passivation layer is formed on the patterned photoresist layer, the gate insulating layer, and the thin film transistor. The patterned photoresist layer is removed, so that the passivation layer thereon is removed simultaneously to form a patterned passivation layer and to expose the source and the drain. After that, a pixel electrode is formed on the patterned passivation layer and the drain.

According to one embodiment of the present invention, the step of forming patterned photoresist layer is completed through a half-tone photolithography etching process (PEP) or a gray-tone PEP.

According to one embodiment of the present invention, the step of forming the channel layer, the source, and the drain includes steps as follows. First, a semiconductor layer is formed on the gate insulating layer, and a second metal layer is formed on the semiconductor layer. Next, the patterned photoresist layer is formed on the second metal layer over the gate, wherein the patterned photoresist layer includes a first photoresist block and a second photoresist block disposed at two sides of the first photoresist block, and a thickness of the first photoresist block is less than a thickness of the second photoresist block. A first etching process is performed on the second metal layer and the semiconductor layer by using the patterned photoresist layer as the mask. Then, a thickness of the photoresist layer is reduced until the first photoresist block is removed completely. A second etching process is performed on the second metal layer by using the remaining second photoresist block as the mask, such that the remaining second metal layer constitutes the source and the drain while the remaining semiconductor layer constitutes the channel layer.

The present invention utilizes a photoresist lift-off process to manufacture the passivation layer. Compared with a method for manufacturing a conventional pixel structure, the present invention can simplify the manufacturing process and reduce the process cost in respect of PEP.

In order to make the aforementioned and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

Figure 2A:
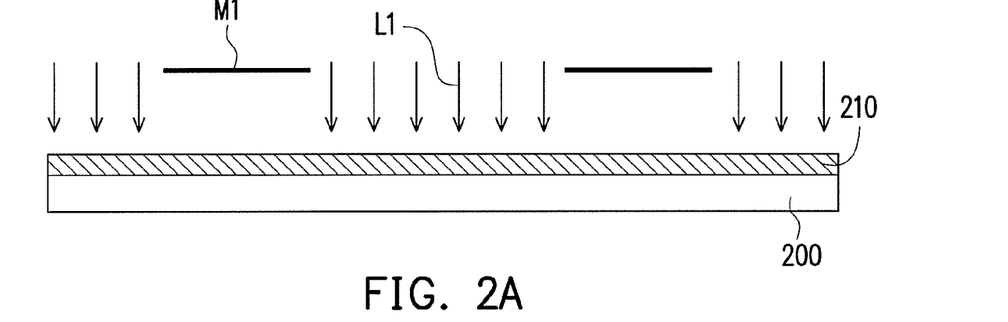
FIGS. 2A to 2I are schematic views illustrating a method for manufacturing a pixel structure according to a first embodiment of the present invention.

FIGS. 2A to 2I are schematic views illustrating a method for manufacturing a pixel structure according to a first embodiment of the present invention. Referring to FIG. 2A, a substrate 200 is provided at first. A material of the substrate 200 includes glass, plastic, and other solid or flexible materials. Next, a first metal layer 210 is formed on the substrate 200, wherein the first metal layer 210 is formed by performing a sputtering process, an evaporation process, or other thin film deposition processes. Then, a first mask M1 is provided over the first metal layer 210. The first mask M1 exposes a portion of the first metal layer 210, and a laser beam L1 is utilized to irradiate the first metal layer 210 through the first mask M1. More specifically, the first metal layer 210 irradiated by the laser beam L1 absorbs the energy of the laser beam L1, and thereby the first metal layer 210 irradiated by the laser beam L1 is ablated from a surface of the substrate 200. In detail, the energy of the laser beam L1 used for ablating the first metal layer 210 ranges from 10 mJ/cm$^2$ to 500 mJ/cm$^2$, for example. In addition, a wavelength of the laser beam L1 ranges from 100 nm to 400 nm, for example.

After that, the portion of the first metal layer 210 exposed by the first mask M1 is removed to form a gate 210' on the substrate 200. It should be noted that, unlike prior arts which utilize expensive masks to manufacture the gate 210', the present embodiment utilizes the inexpensive mask M1 to complete the manufacture of the gate 210', and thereby the process cost is reduced. However, in the present invention, the manufacture of the gate 210' is not limited to the above-mentioned. In other words, the gate 210' may be manufactured by performing a photolithography and etching process.

Figure 2B:
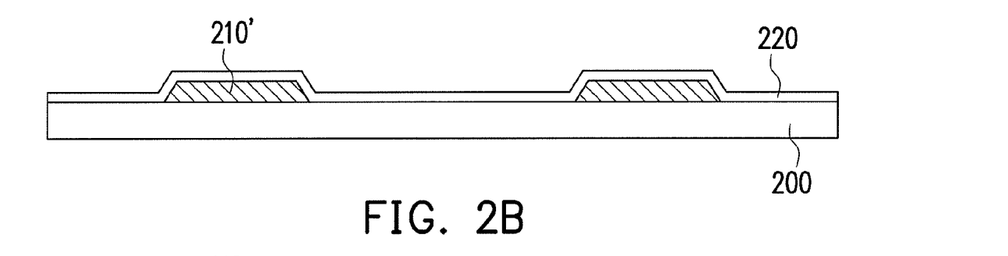

Thereafter, referring to FIG. 2B, a gate insulating layer 220 is formed on the substrate 200 to cover the gate 210'. The gate insulating layer 220 is formed by performing a chemical vapor deposition (CVD) process or other suitable thin film deposition processes, for example. A material of the gate insulating layer 220 includes, for example, silicon oxide, silicon nitride, silicon oxy-nitride, or other dielectric materials.

Figure 2C:
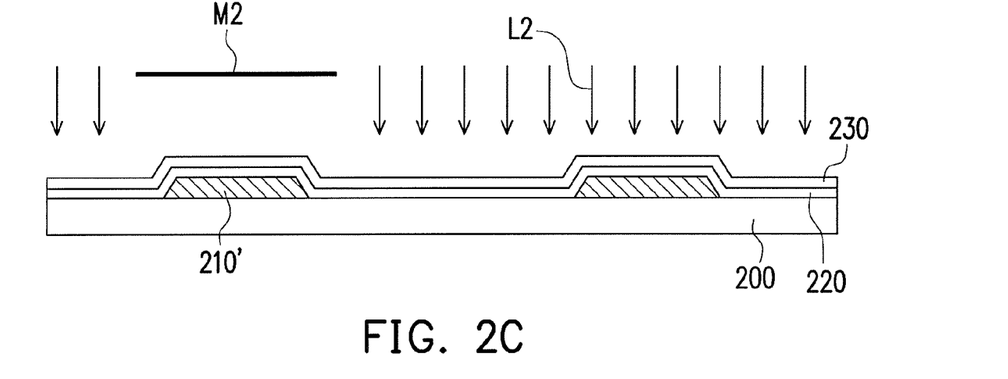
Figure 2D:
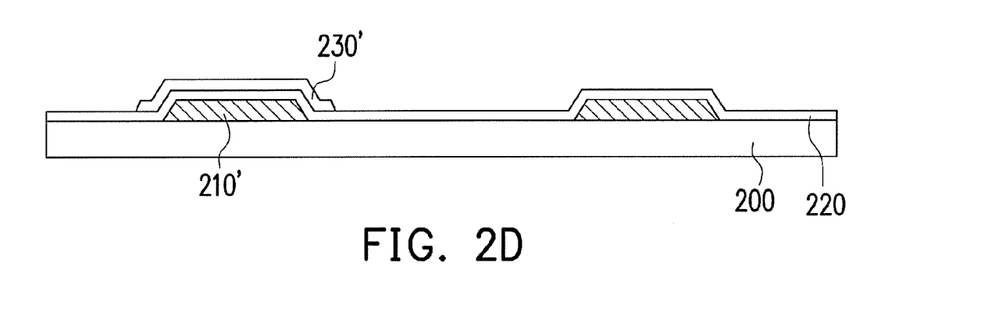

Then, referring to FIGS. 2C and 2D, a semiconductor layer 230 is formed on the gate insulating layer 220. In the present embodiment, a material of the semiconductor layer 230 includes, for example, amorphous silicon or other semiconductor materials. Next, a second mask M2 is provided over the semiconductor layer 230 and exposes a portion of the semiconductor layer 230. After that, a laser beam L2 irradiates the semiconductor layer 230 through the second mask M2. the semiconductor layer 230 irradiated by the laser beam L2 absorbs the energy of the laser beam L2, and thereby the semiconductor layer 230 irradiated by the laser beam L2 is ablated from a surface of the gate insulating layer 220. At this time, a channel layer 230' is formed on the gate insulating layer 220. However, in the present invention, the manufacture of the gate 230' is not limited to the above-mentioned. In other words, the gate 230' may be manufactured by performing a photolithography and etching process.

Figure 2E:
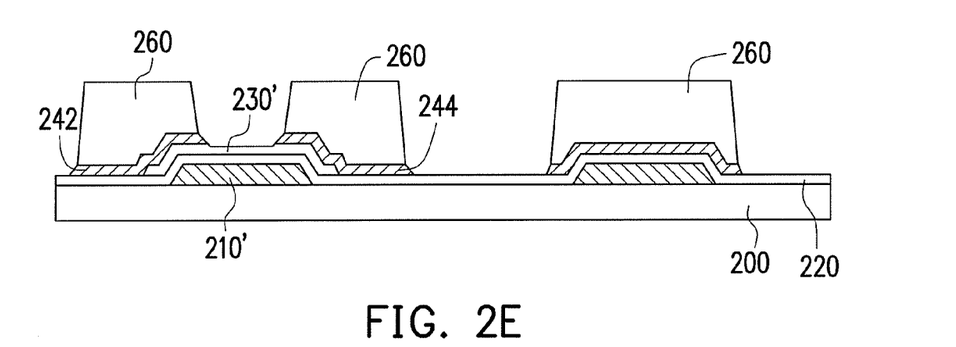

Then, referring to FIG. 2E, a second metal layer 240 (now shown) is formed on the gate insulating layer 220 and the channel layer 230', and a patterned photoresist layer 260 is used as the mask to pattern the second metal layer 240, so as to form a source 242 and a drain 244. The gate 210', the channel layer 230', the source 242 and the drain 244 constitute a thin film transistor. According to the present embodiment, a material of the source 242 and the drain 244 includes, for example, aluminum (Al), molybdenum (Mo), titanium (Ti), neodymium (Nd) and nitride of any of the aforementioned, such as MoN, TiN, stacked layers thereof, and any alloy of the aforementioned or other conductive materials.

Figure 2F:
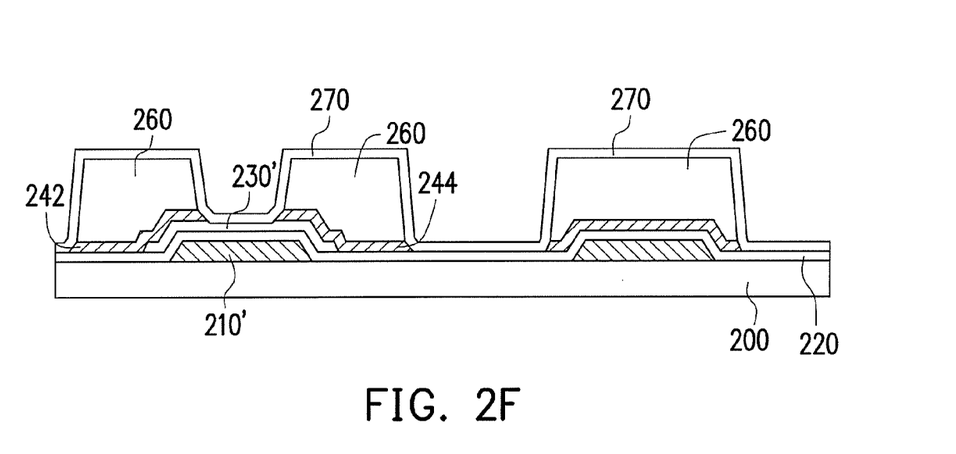

Referring to FIG. 2F, after the source 242 and the drain 244 are formed, a passivation layer 270 which completely covers the patterned photoresist layer 260, the gate insulating layer 220, and the thin film transistor is formed. According to the present embodiment, a material of the passivation layer 270 includes, for example, silicon nitride, silicon oxide, and the passivation layer 270 is formed by performing a physical vapor deposition (PVD) process or the CVD process, for example.

Figure 2G:
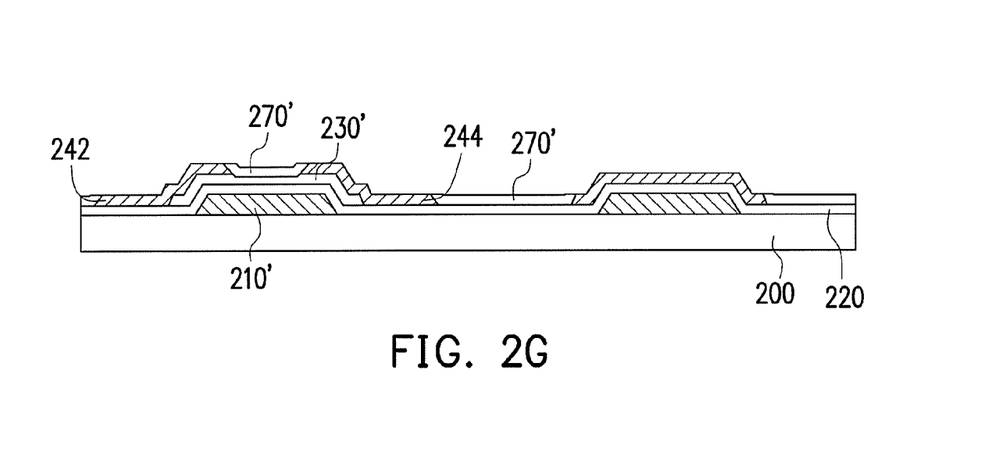

Next, referring to FIG. 2G, the patterned photoresist layer 260 is removed, so that a portion of the passivation layer 270 disposed on the patterned photoresist layer 260 is removed simultaneously to expose the source 242 and the drain 244. At this time, the passivation layer 270 is patterned to form the patterned passivation layer 270'. It should be noted that, the above-mentioned step of simultaneously removing the patterned photoresist layer 260 and the portion of the passivation layer 270 is a kind of lift-off process, and the passivation layer 270 can be patterned effectively.

Figure 2H:
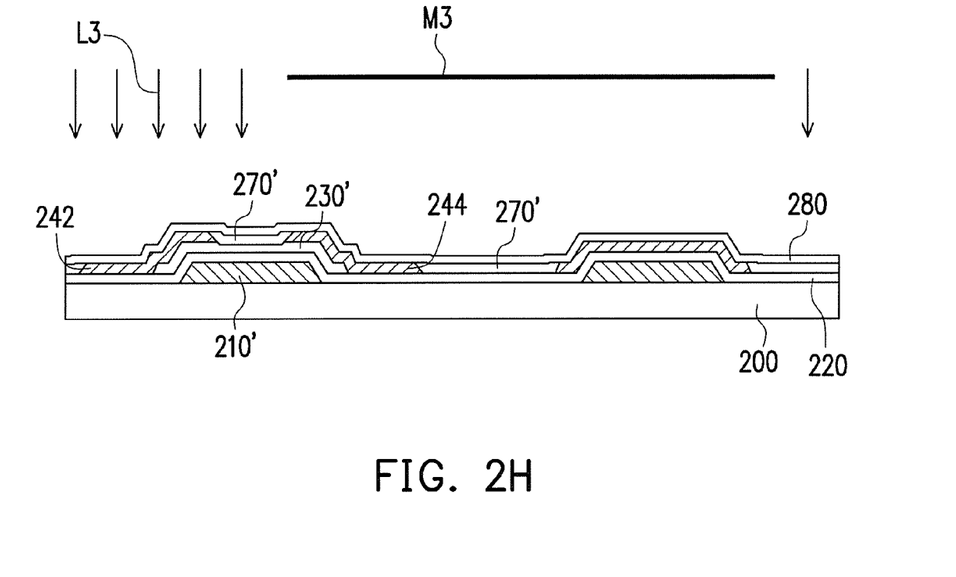
Figure 2I:
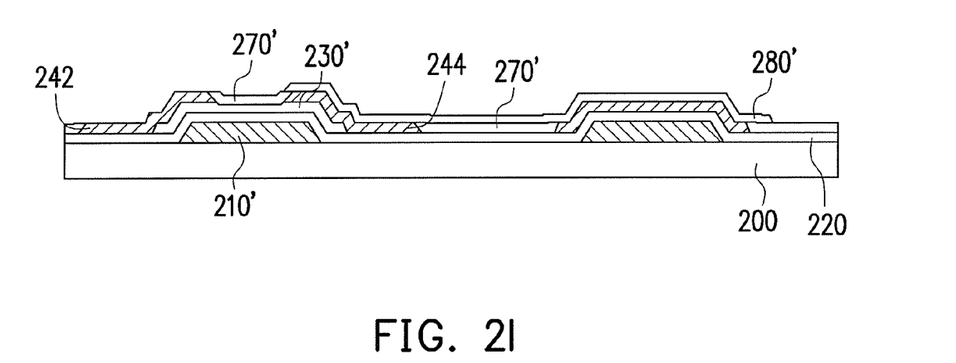

Afterward, referring to FIGS. 2H and 2I, a conductive layer 280 is formed on the source 242, the drain 244, and the passivation layer 270'. According to the present embodiment, a material of the conductive layer 280 includes, for example, indium tin oxide (ITO), indium zinc oxide (IZO), or other conductive materials. Then, a third mask M3 is provided over the conductive layer 280. The third mask exposes a portion of the conductive layer 280. After that, a laser beam L3 is utilized to irradiate the conductive layer 280 through the third mask M3. The conductive layer 280 irradiated by the laser beam L3 absorbs the energy of the laser beam L3, and thus is ablated from a portion of a surface of the patterned passivation layer 270' and the source 242, so as to form a pixel electrode 280' on the drain 244 and a portion of the passivation layer 270'. However, in the present invention, the manufacture of the gate 280' is not limited to the above-mentioned. In other words, the gate 280' may be manufactured by performing a photolithography and etching process.

Second Embodiment

Figure 3A:
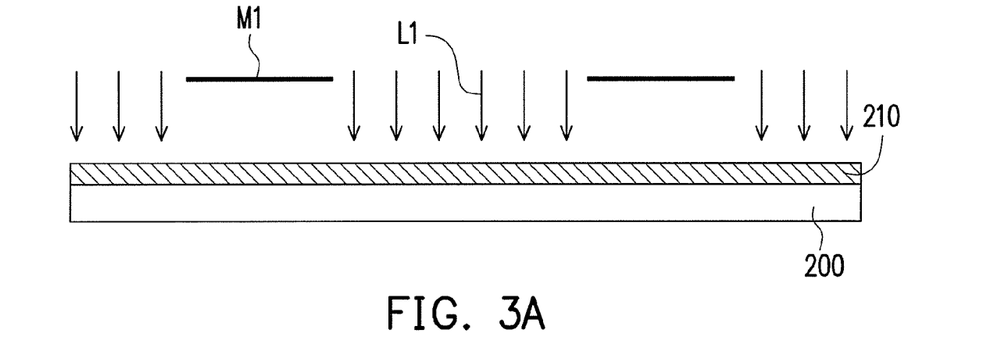
FIGS. 3A to 3I are schematic views illustrating a method for manufacturing the pixel structure according to a second embodiment of the present invention.
Figure 3B:
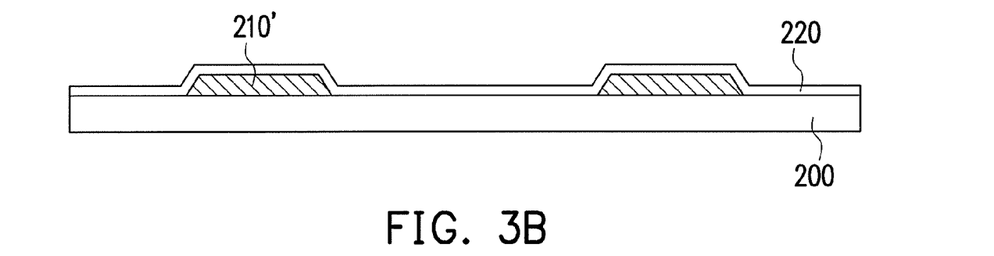

FIGS. 3A to 3I are schematic views illustrating a method for manufacturing the pixel structure according to a second embodiment of the present invention. According to the present embodiment, the channel layer, the source, and the drain are simultaneously formed. Detailed descriptions are provided below with reference to FIGS. 3C to 3I. A processing flow shown by FIGS. 3A to 3B is the same as that shown by FIGS. 2A to 2B, and a process flow shown by FIGS. 3F to 3I is the same as that shown by FIGS. 2F to 2I, so detailed descriptions are not repeated.

Figure 3C:
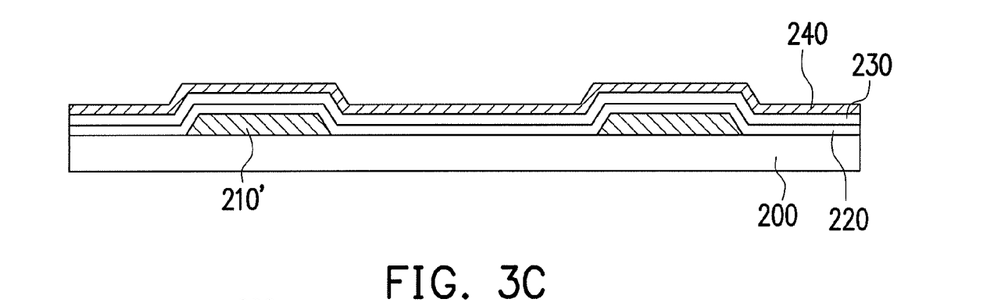

Referring to FIG. 3C, a semiconductor layer 230 and a second metal layer 240 are formed on the gate insulating layer 220 sequentially. According to the present embodiment, a material of the semiconductor layer 230 includes, for example, amorphous silicon or other semiconductor materials.

Figure 3D:
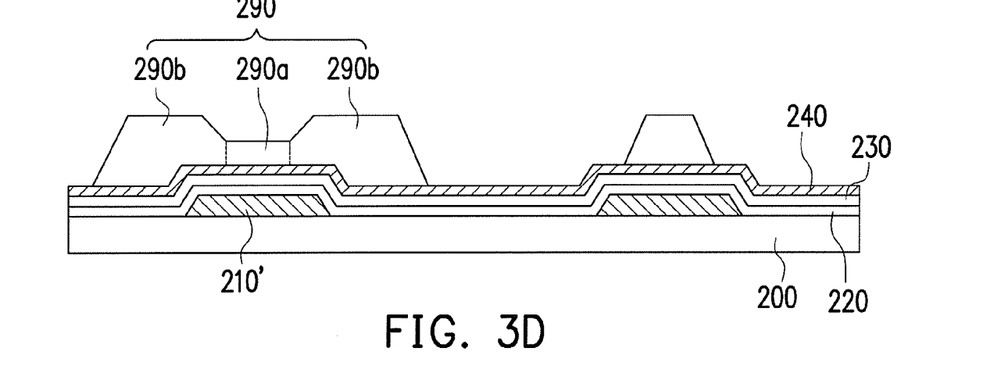

Referring to FIG. 3D, a photoresist layer 290 is formed on the second metal layer 240 over the gate 210' after the second metal layer 240 is formed. As shown by FIG. 3D, the photoresist layer 290 can be divided into a first photoresist block 290a and a second photoresist block 290b at two sides of the first photoresist block 290a. A thickness of the first photoresist block 290a is less than a thickness of the second photoresist block 290b. Then, a first etching process is performed on the second metal layer 240 and the semiconductor layer 230 by using the photoresist layer 290 as the mask.

Figure 3E:
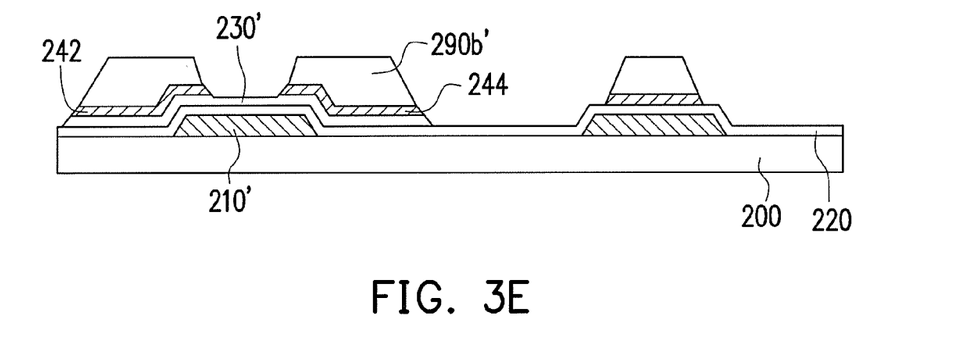
Figure 3F:
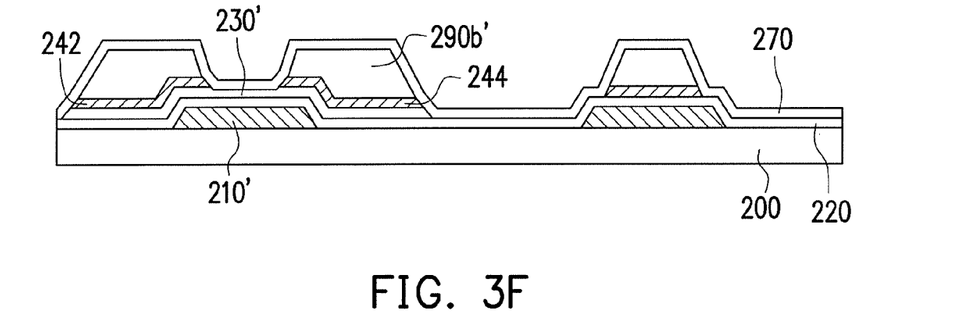
Figure 3G:
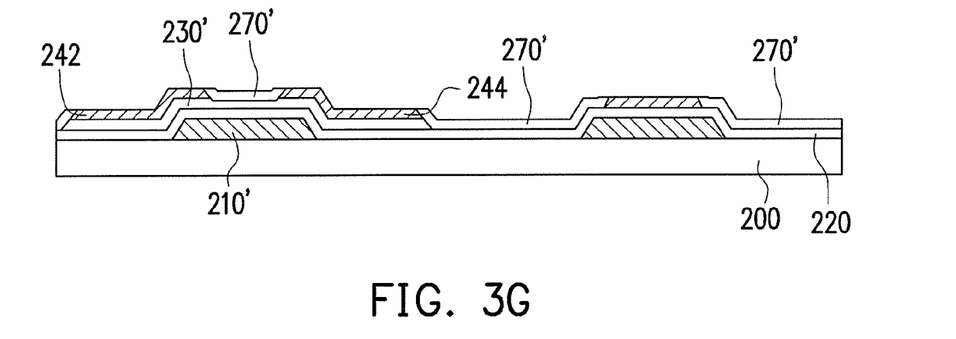
Figure 3H:
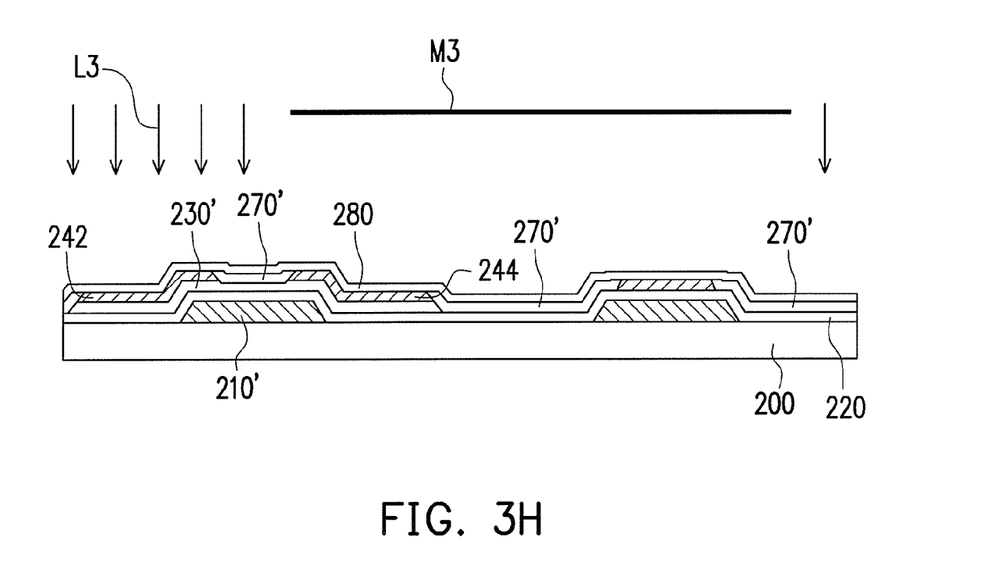
Figure 3I:
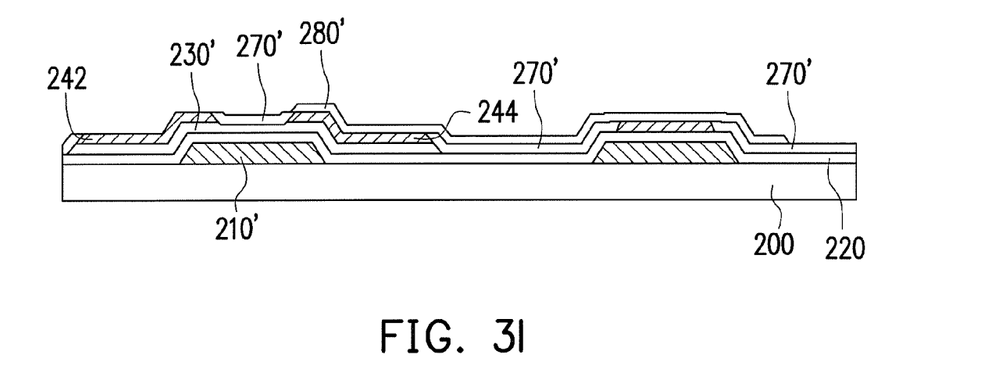

After that, a thickness of the photoresist layer 290 is reduced until the first photoresist block 290a is removed completely, as shown by FIG. 3E, wherein a method of reducing the thickness of the photoresist layer 290 includes, for example, performing an ashing process. Referring to FIG. 3E, after the first photoresist block 290a is completely removed, a second etching process is performed on the second metal layer 240 by using the remaining second photoresist block 290b' as the mask. According to the present embodiment, the first etching process and the second etching process include, for example, performing a wet etching process. In other embodiments, a dry etching process may also be performed.

In summary, the method for manufacturing the pixel structure provided by the present invention has at least the following advantages.

1. The method for manufacturing the pixel structure provided by the present invention does not require performing a photolithography process for manufacturing the passivation layer. Therefore, compared with a conventional PEP which needs to be performed with high precision, the present invention is conducive to reducing the process cost of manufacturing the mask.

2. Fewer steps are involved in the manufacturing process of the pixel structure in the present invention, so defects caused during the long PEP for manufacturing the pixel structure (such as photoresist coating, soft baking, hard baking, exposure, development, etching, photoresist stripping, and the like) are reduced.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method for manufacturing a pixel structure, comprising:

providing a substrate;

forming a gate on the substrate;

forming a gate insulating layer on the substrate to cover the gate;

forming a channel layer on the gate insulating layer over the gate;

forming a second metal layer on the channel layer;

forming a patterned photoresist layer on the second metal layer, and removing a portion of the second metal layer by using the patterned photoresist layer as a mask to form a source and a drain on the channel layer at two sides of the gate, wherein the gate, the channel layer, the source, and the drain constitute a thin film transistor;

forming a passivation layer on the patterned photoresist layer, the gate insulating layer, and the thin film transistor;

removing the patterned photoresist layer, wherein the passivation layer on the patterned photoresist layer is removed simultaneously to form a patterned passivation layer and to expose the source and the drain; and forming a pixel electrode on the patterned passivation layer and the drain.

2. The method for manufacturing the pixel structure according to claim 1, wherein the step of forming the gate comprises:

forming a first metal layer on the substrate; and patterning the first metal layer to form the gate.

3. The method for manufacturing the pixel structure according to claim 2, wherein the step of patterning the first metal layer comprises performing a laser ablation process or performing a photolithography and etching process.

4. The method for manufacturing the pixel structure according to claim 1, wherein the step of forming the channel layer comprises:

forming a semiconductor layer on the gate insulating layer; and patterning the semiconductor layer to form the channel layer.

5. The method for manufacturing the pixel structure according to claim 4, wherein the step of patterning the semiconductor layer comprises performing a laser ablation process or performing a photolithography and etching process.

6. The method for manufacturing the pixel structure according to claim 1, wherein the step of forming the gate insulating layer comprises forming a silicon nitride layer through a chemical vapor deposition (CVD) process.

7. The method for manufacturing the pixel structure according to claim 1, wherein the step of forming the pixel electrode comprises:

forming a conductive layer on the patterned passivation layer and the remaining second metal layer; and patterning the conductive layer to form the pixel electrode.

8. The method for manufacturing the pixel structure according to claim 7, wherein the step of forming the conductive layer comprises forming an indium tin oxide (ITO) layer or an indium zinc oxide (IZO) layer by performing a sputtering process.

9. The method for manufacturing the pixel structure according to claim 7, wherein the step of patterning the conductive layer comprises performing a laser ablation process or performing a photolithography and etching process.

10. A method for manufacturing a pixel structure, comprising:

providing a substrate;

forming a gate on the substrate;

forming a gate insulating layer on the substrate to cover the gate;

forming a channel layer on the gate insulating layer over the gate;

forming a second metal layer above the gate insulating layer;

forming a patterned photoresist layer on the second metal layer, and removing a portion of the second metal layer by using the patterned photoresist layer as a mask to form a source and a drain, wherein the gate, the channel layer, the source, and the drain constitute a thin film transistor;

forming a passivation layer on the patterned photoresist layer, the gate insulating layer, and the thin film transistor;

removing the patterned photoresist layer, wherein the passivation layer on the patterned photoresist layer is removed simultaneously to form a patterned passivation layer; and forming a pixel electrode on the patterned passivation layer and the drain.

* * * * *